(12) United States Patent
Zhang

(10) Patent No.: US 6,785,862 B1
(45) Date of Patent: Aug. 31, 2004

(54) CONVOLUTIONAL INTERLEAVER EMPLOYING AN EFFICIENT MEMORY SCHEME

(75) Inventor: Xuming Zhang, Mission Viejo, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 377 days.

(21) Appl. No.: 09/929,500

(22) Filed: Aug. 14, 2001

(51) Int. Cl.$^7$ ............................................. H03M 13/03
(52) U.S. Cl. ...................... 714/788; 714/762; 714/702
(58) Field of Search ................................ 714/702–701, 714/786–796, 762–761

(56) References Cited

U.S. PATENT DOCUMENTS

| | | | | |
|---|---|---|---|---|
| 5,636,224 A | * | 6/1997 | Voith et al. .................. | 714/701 |
| 5,745,497 A | * | 4/1998 | Ben-Efraim et al. ........ | 714/702 |
| 5,771,239 A | * | 6/1998 | Moroney et al. ........... | 370/474 |
| 5,886,998 A | * | 3/1999 | Voith et al. .................. | 714/702 |
| 5,928,371 A | * | 7/1999 | Robinson et al. ........... | 714/702 |
| 6,339,834 B1 | * | 1/2002 | Crozier et al. .............. | 714/701 |
| 6,363,470 B1 | * | 3/2002 | Laurenti et al. ............ | 711/220 |
| 6,421,796 B1 | * | 7/2002 | Gatherer ..................... | 714/702 |
| 6,434,170 B1 | * | 8/2002 | Movshovich et al. ....... | 370/536 |

FOREIGN PATENT DOCUMENTS

EP                369920 A2 * 5/1990 ............. G06F/5/06

* cited by examiner

*Primary Examiner*—Guy J. Lamarre
(74) *Attorney, Agent, or Firm*—Farjami & Farjami LLP

(57) ABSTRACT

A convolutional interleaver includes an interleaver memory partitioned into a plurality of circular buffers, wherein each of the circular buffers has associated write pointers and read pointers, and wherein the interleaver is configured to selectively read symbols from an input vector and store the input symbols in the interleaver memory in accordance with the write pointers, and to selectively read symbols from the interleaver memory to form an output vector in accordance with the read pointers. In one aspect, symbols are written to the interleaver prior to reading; in another, the position of the write pointer corresponds to the position of the read pointer within the circular buffer, and symbols are read from said interleaver memory prior to writing. In another aspect, a de-interleaver applies the concepts and algorithms described above in an inverse manner.

24 Claims, 15 Drawing Sheets

Input Vector to the Interleaver
(Prior Art)

Output Vector from the Interleaver
(Prior Art)

Fig. 4 (Prior Art), with N = 15 and D = 4 (co-primed)

Fig. 5 (Prior Art), with N = 14 and D = 4 (not co-primed)

Initialization

Write Process

Read first and then write

Initialization

RAM arrangement for a de-interleaver (N=15, D=4)

Alternate RAM arrangement of a de-interleaver

CONVOLUTIONAL INTERLEAVER EMPLOYING AN EFFICIENT MEMORY SCHEME

BACKGROUND OF THE INVENTION

1. Field of the Invention

The present invention relates, generally, to digital communications and, more particularly, to the use of convolutional interleavers for forward error correction (FEC) in digital systems. More particularly, an efficient memory scheme for convolutional interleaving is disclosed.

2. Background Art

In digital communication systems, for example, in the context of digital subscriber line technology (xDSL, ADSL, VDSL etc.), it is desirable to provide reliable and robust error correction capability. One popular method of providing error correction involves the use of Reed-Solomon (R-S) code in conjunction with a convolutional interleaver. The purpose of the is combination of R-S code and interleaving is to spread bursts of errors such that adjacent bytes in the transmitted data stream do not originate from the same codeword; thus, it reduces the number of errors in any one codeword to what can be corrected by the R-S decoder (usually half of the number of redundant check bytes added in the code). The data bytes are then reordered at the receiver by a de-interleaver.

Two important parameters which characterize an interleaver are the number of bytes per interleaving block length, N, and the interleaver depth, D, which is defined as the minimum separation at the output of the interleaver of any two input bytes in the same codeword. N can be chosen to be the same length as, or a fractional length of, the R-S codeword. In this application, we will assume N is the same as the R-S codeword length. It will be appreciated, however, that the present invention is not so limited.

There are two main interleaving methods: block interleaving and convolutional interleaving. Both types of interleaving change the order of the transmitted bytes of an outgoing stream, but do so in a deterministic fashion so that the stream can be restored upon receipt. Block interleaving fills in a fixed-size block by rows and then sends the data out by columns. N×D total bytes must be stored in each of two transmit memories of a block interleaver and a total 4×N×D bytes memory area is required for an end-to-end systems (2N×D for the transmitter and 2N×D for the receiver). Compared to convolutional interleavers, block interleavers are not very efficient in terms of memory use and end-to-end delay. In general, convolutional interleavers reduce the delay and memory by a factor of 2 to 4 for the similar burst error distribution.

For a convolutional interleaver, each of the N bytes $B_i^k$ in a R-S codeword (say k-th codeword as shown in FIG. 4) is delayed by an amount that varies linearly with the byte index i, where precisely, byte $B_i^k$ (with index i) is delayed by i×(D−1) bytes. With the above defined rule, and the chosen interleaving depths, the output bytes from the interleaver always occupy distinct time slots when N and D are co-primed as shown in FIG. 4 with N=15, D=4. When they are not co-primed, dummy bytes are typically added at the beginning of the codeword at the input to the interleaver, and then (N−1) and D are co-primed. The resultant codeword is then convolutionally interleaved, and the dummy byte is removed from the output of the interleaver as in FIG. 5, where N=14, D=4.

The interleaver scheme adopted in ANSI T1.413, and ITU G.992.1/G.992.2 (ADSL) is based on a system originally proposed in Aslanis, J. T., Tong, P. T. and Zogakis, T. N., "An ADSL proposal for selectable forward error correction with convolutional interleaving", Aug. 20, 1992, TIE1.4: ADSL; and Tong, P. T., Zoagkis, T. N. and Cioffi, J. M., "Revised FEC and interleaving recommendations for DMT ADSL", TIE1.4/93–117, May 1993.

A special type of triangular convolutional interleaver, adopted in the latest ANSI T1E1 VDSL draft, requires that the interleaver depth be D=N×M+1, where M is an integer. The implementation requires a memory of (N−1)×(D−1) bytes, but the constraint on D is very inconvenient for xDSL, when a typical xDSL system uses D<N. A conventional method of implementing the convolutional interleaver, arranged in a one-dimensional array, is to use a circular buffer of circumference N×D. For input byte $B_i^k$, the i-th byte in the k-th R-S codeword is as follows:

write address=$(k \times N + i \times D)$ mod N×D, for i=0, 1, . . . , N−1, k=0,1, . . . , D−1 read address=$(k \times N + i)$ mod N×D, for i=0,1, . . . , N−1, k=0,1, . . . , D−1.

Alternatively, one can also use a N×D matrix with n as column index and m as row index as shown in FIGS. 4–5 as follows, write address: $(n,m)=((i \times D)$ mod N, $(k+i \times D)$ mod mod D), read address: $(n,m)=(i, k$ mod D), $\forall i$=0,1, . . . , N−1, k=0,1, . . . ,D−1.

It can be shown that the memory requirement of the conventional implementation of the convolutional interleaver is N×D bytes. Thus, the convolutional interleaver needs no more than half the memory of a block interleaver but twice that of triangular interleaver. As the codeword length and interleaver depth increase for such interleaver systems, the memory requirements become quite significant. As memory requires a significant amount of chip area, it is often necessary to implement such interleavers using multiple integrated circuits, which increases cost, size, and interconnect complexity.

Even in the event the interleaver and memory are included on a single chip, such chips tend to be large. Due to defect density in semiconductor manufacturing, the process yield (i.e., the number of good chips per wafer) is significantly reduced.

Referring now to FIGS. 4 and 5, it should be noted that at any time epoch k almost half of bytes in the memory need not be stored because they have already been transmitted. The memory locations vacated are available for storing new incoming bytes. U. S. Pat. No. 5,764,649 ("Tong") discloses a fairly complicated addressing scheme—involving reading one byte from an address, writing to the same address, and then calculating the next address. The Tong method can reduce the memory requirement to almost ND/2, which is the theoretical limit. However, the Tong method is unsatisfactory in a number of respects. For example, in order to reduce the memory requirement, the computational-complexity of the algorithm is high and difficult to implement. In particular, this scheme uses at least 3N programmable registers to address the interleaver memory. Thus, there is an intense need for convolutional interleaver designs, which incorporate a more efficient interleaver memory arrangement. More particularly, there is a need for improved convolutional interleaving methods which save memory while significantly reduce programming complexity.

SUMMARY OF THE INVENTION

In accordance with one aspect of the present invention, a convolutional interleaver includes an interleaver memory partitioned into a plurality of circular buffers, wherein each of said circular buffers has a write pointer and a read pointer associated therewith, and wherein the interleaver is configured to selectively read symbols from an input vector and store the input symbols in the interleaver memory in accordance with said write pointers, and to selectively read symbols from said interleaver memory to form an output vector in accordance with said read pointers.

In a further aspect of the present invention, symbols are written to the interleaver prior to reading. In accordance with another aspect, the position of the write pointer corresponds to the position of the read pointer within the circular buffer, and symbols are read from said interleaver memory prior to writing. In this way, the size of the interleaver memory can be significantly reduced. More importantly, the present invention approaches the theoretical memory limit with much lower complexity.

BRIEF DESCRIPTION OF THE DRAWINGS

The subject invention will hereinafter be described in conjunction with the appended drawing figures, wherein like numerals denote like elements, and:

FIG. 4 shows a conventional interleaver memory arrangement in which N and D are co-primed;

FIG. 5 shows a conventional interleaver memory arrangement in which N and D are not co-primed;

DETAILED DESCRIPTION OF EXEMPLARY EMBODIMENTS

Systems and methods in accordance with various aspects of the present invention provide an improved interleaver memory arrangement employing multiple circular buffers. In this regard, the present invention may be described herein in terms of functional block components and various processing steps. It should be appreciated that such functional blocks may be realized by any number of hardware and/or software components configured to perform the specified functions. For example, the present invention may employ various integrated circuit components, e.g., memory elements, digital signal processing elements, look-up tables, and the like, which may carry out a variety of functions under the control of one or more microprocessors or other control devices. In addition, those skilled in the art will appreciate that the present invention may be practiced in any number of data communication contexts and that the various systems described herein are merely exemplary applications for various aspects of the invention. Further, it should be noted that the present invention may employ any number of conventional techniques for data transmission, training, signal processing and conditioning, and the like. Such general techniques that are known to those skilled in the art are not described in detail herein.

Figure 1:
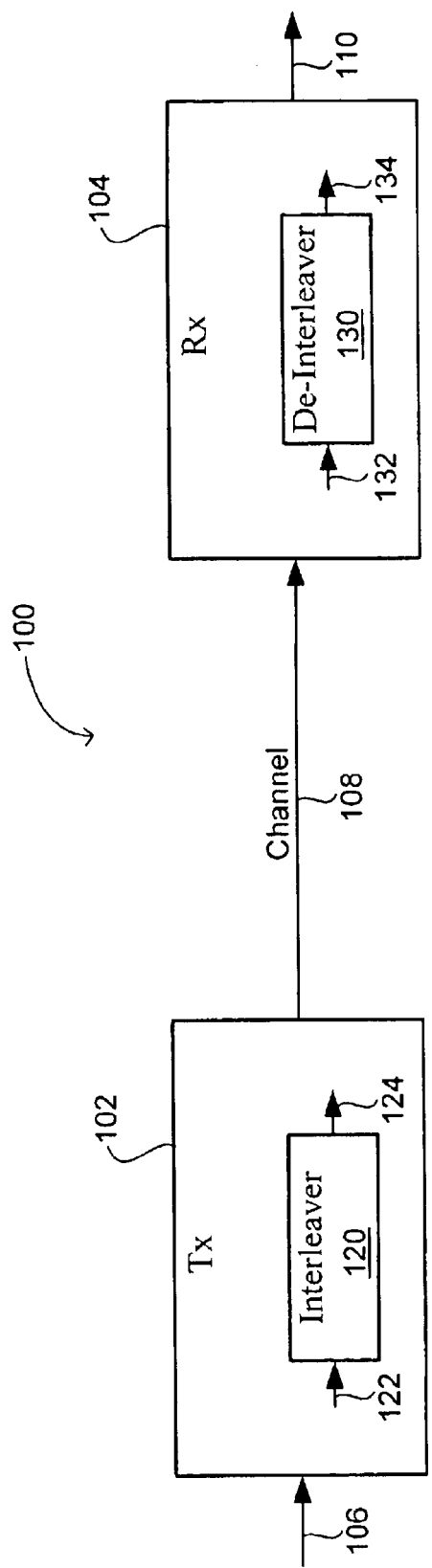
FIG. 1 is schematic overview of a data communication system in which the present invention may be employed.

As shown in FIG. 1 a generalized communication system 100 includes a transmitter 102 which accepts an input signal 106 and transmits data over a channel 108 to a receiver 104. Receiver 104 produces an output signal 110 representative of input signal 106. Transmitter 102 includes an interleaver 120, and receiver 104 includes a de-interleaver 130. Interleaver 120 accepts an input 122 (e.g., a series of codewords) and processes the data to produce an interleaver output 124. Output 124 may or may not be processed for transmission over channel 108, whereupon de-interleaver 130 processes the interleaved data 132 to produce a de-interleaved signal 134. In one embodiment, channel 108 represents an xDSL connection, and transmitter 102 comprises an xDSL modem; however, those skilled in the art will recognize that the present invention may be employed in a wide variety of contexts.

Interleaver 120 and de-interleaver 130 may comprise any combination of hardware and software capable of performing the tasks set forth below. Typically, an interleaver includes one or more semiconductor chips providing read only memory (ROM), random access memory (RAM), hard-wired logic, signal processing, and the like. As will be discussed shortly, one advantage of the present invention relates to the reduction of memory needed to accomplish interleaving, thus reducing the number and/or size of semiconductor devices required for interleaver 120 and de-interleaver 130.

There are various designs currently known for interleaver 120. One of the more popular types of interleavers is the convolutional interleaver. A convolutional interleaver receives an input vector (comprising a string of bytes or "symbols") then reorders the bytes to produce a convolved output in accordance with a predetermined algorithm. Due to redistribution of the input vector bytes, the resulting output data stream is less susceptible to burst errors and the like.

Figure 2:
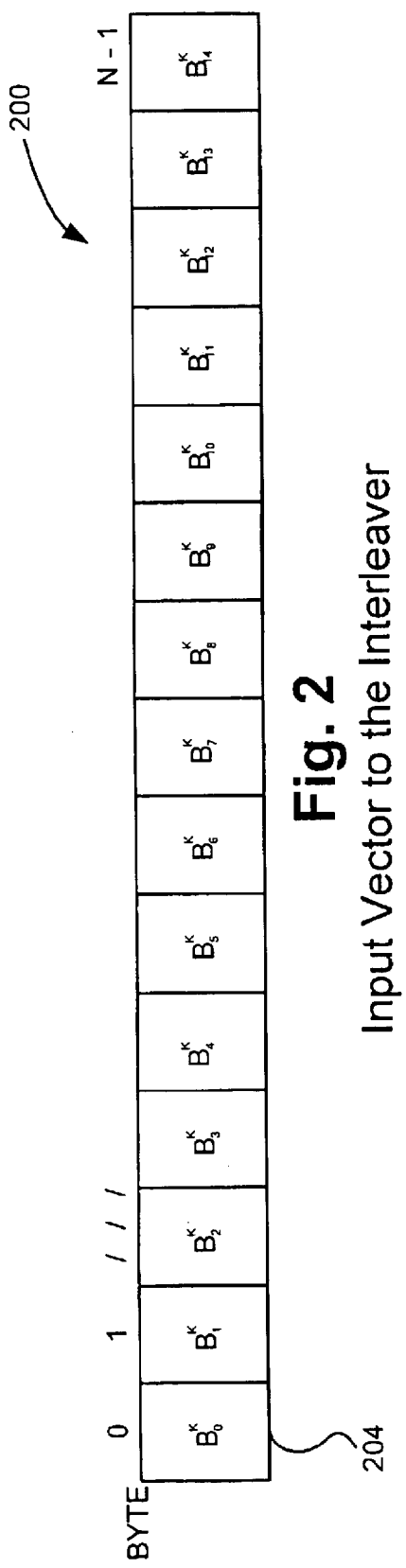
FIG. 2 shows an exemplary 15-byte input vector.

Referring now to FIGS. 2–5, a conventional memory arrangement will now be described. In general, as shown in FIG. 2, an input vector 200 comprises a series of bytes 204. The superscript k refers to the codeword index, and the length N of input vector 200 is referred to as the codeword length.

Figure 3:
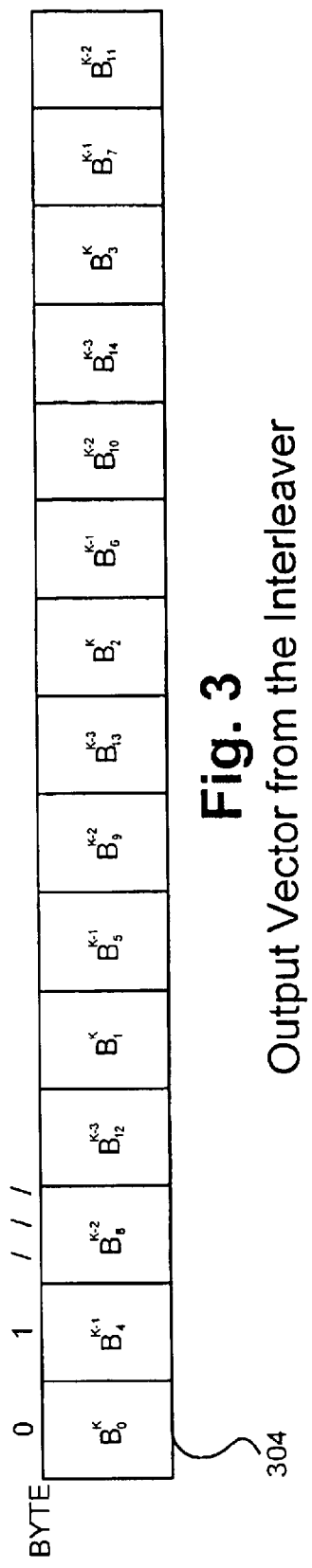
FIG. 3 shows an exemplary 15-byte output vector.

With reference to FIG. 3, the interleaver (described further below) is configured to produce an output vector 300 which comprises a series of N bytes 304. Output vector 300 comprises a reordering of bytes from the present input vector 200 and bytes from past input vectors (i.e., with past codeword indices).

Figures 4, 5:
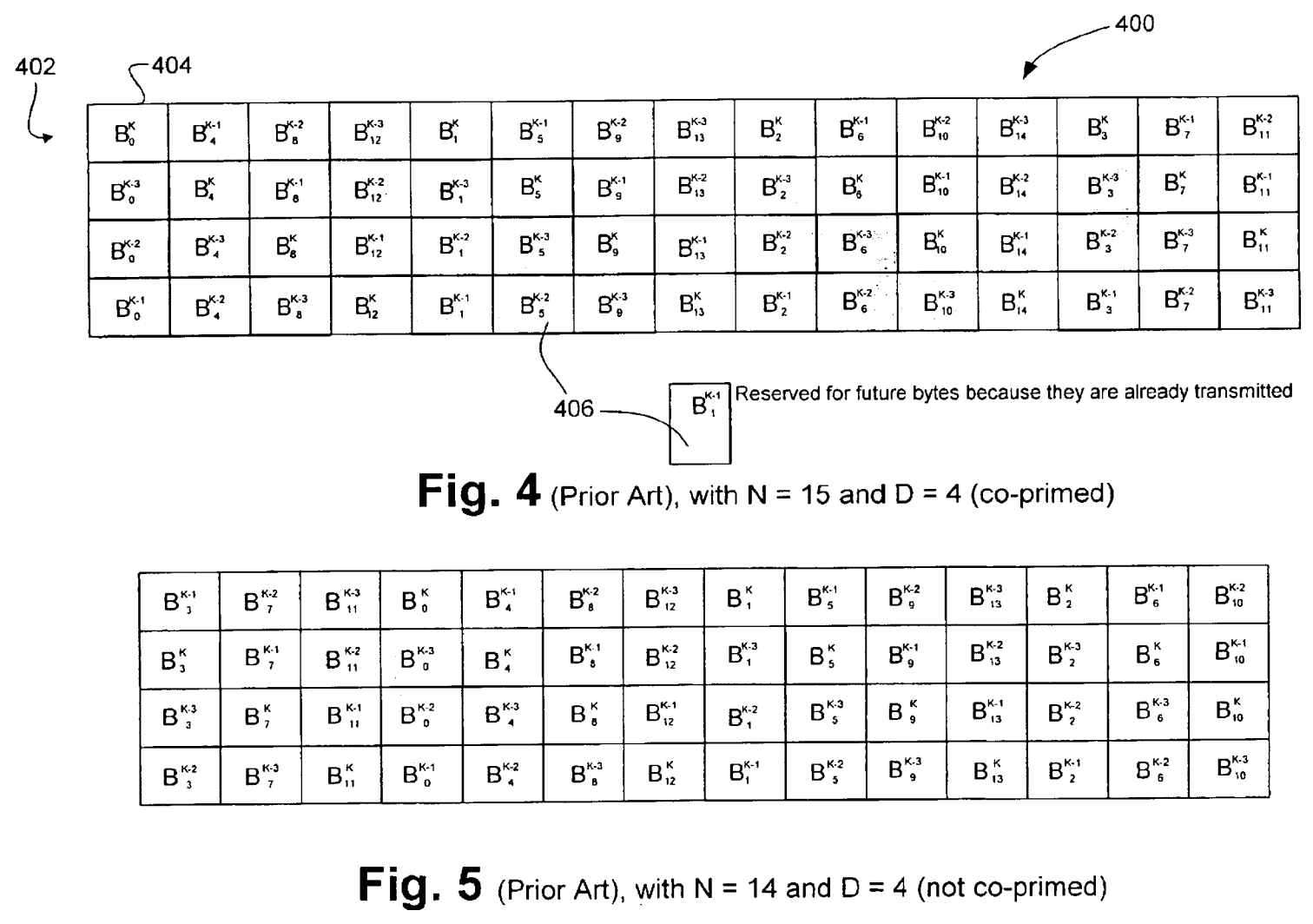

As shown in FIG. 4, a conventional interleaver memory 400 is configured as a table having N columns and a number of rows corresponding to the interleaving depth, where each unoccupied cell contains a single byte 404. The interleaving depth is essentially the "depth" of past codeword information stored in interleaver memory 400. In this example, the codeword length N is 15 and interleaving depth D is 4. It will be appreciated that the present invention is not so limited, and that other values of N and D may be used. For example, systems typically employ a codeword length N ranging from 1 to 255, and a interleaving depth D ranging from 1 to 64 (typically by powers of two, e.g., 1, 2, 4, 8, 16, 32, or 64).

With continued reference to FIG. 4, it will be appreciated that almost half of memory requirement for a simple implementation of the convolutional interleaver is wasted on space reserved for future bytes (i.e., bytes 406) because those bytes were already transmitted (see shaded areas). In general, the present invention addresses this problem through the use of a novel interleaver memory arrangement employing multiple circular buffers. As will be shown, this method reduces computational complexity while saving approximately half of the interleaver memory area when compared to conventional methods.

More particularly, let L[d] denote the number of bytes in output vector 300 having an associated delay depth d, where d=0,1, . . . ,D−1. Significantly, L[d] is a function of N and D only, and can be calculated recursively in accordance with whether N is odd or even. That is: Case 1: If N is odd and D=1,2,4, . . . 64, then:

$$L[0] = \left\lceil \frac{N}{D} \right\rceil,$$

$$L[d] = \left\lceil \frac{(d+1)N}{D} \right\rceil - \sum_{i=0}^{d-1} L[i] = \left\lceil \frac{(d+1)N}{D} \right\rceil - \left\lceil \frac{dN}{D} \right\rceil,$$

$$d = 1, \ldots D-1$$

where $\lceil x \rceil$ denotes the smallest integer that is greater than or equal to x (ceiling of x).

Case 2: If N is even and D=1, 2,4, . . . , 64, then:

$$L[0] = \left\lfloor \frac{N+1}{D} \right\rfloor,$$

$$L[d] = \left\lfloor \frac{(d+1) \times (N+1)}{D} \right\rfloor - \sum_{i=0}^{d-2} L[i] = \left\lfloor \frac{(d+1) \times (N+1)}{D} \right\rfloor - \left\lfloor \frac{d \times (N+1)}{D} \right\rfloor, d = 1, \ldots, D-2,$$

$$L[D-1] = N - \sum_{i=1}^{D-2} L[i],$$

where $\lfloor x \rfloor$ represents the largest integer that is less than or equal to x (flooring of or integer portion of x).

Figure 6:
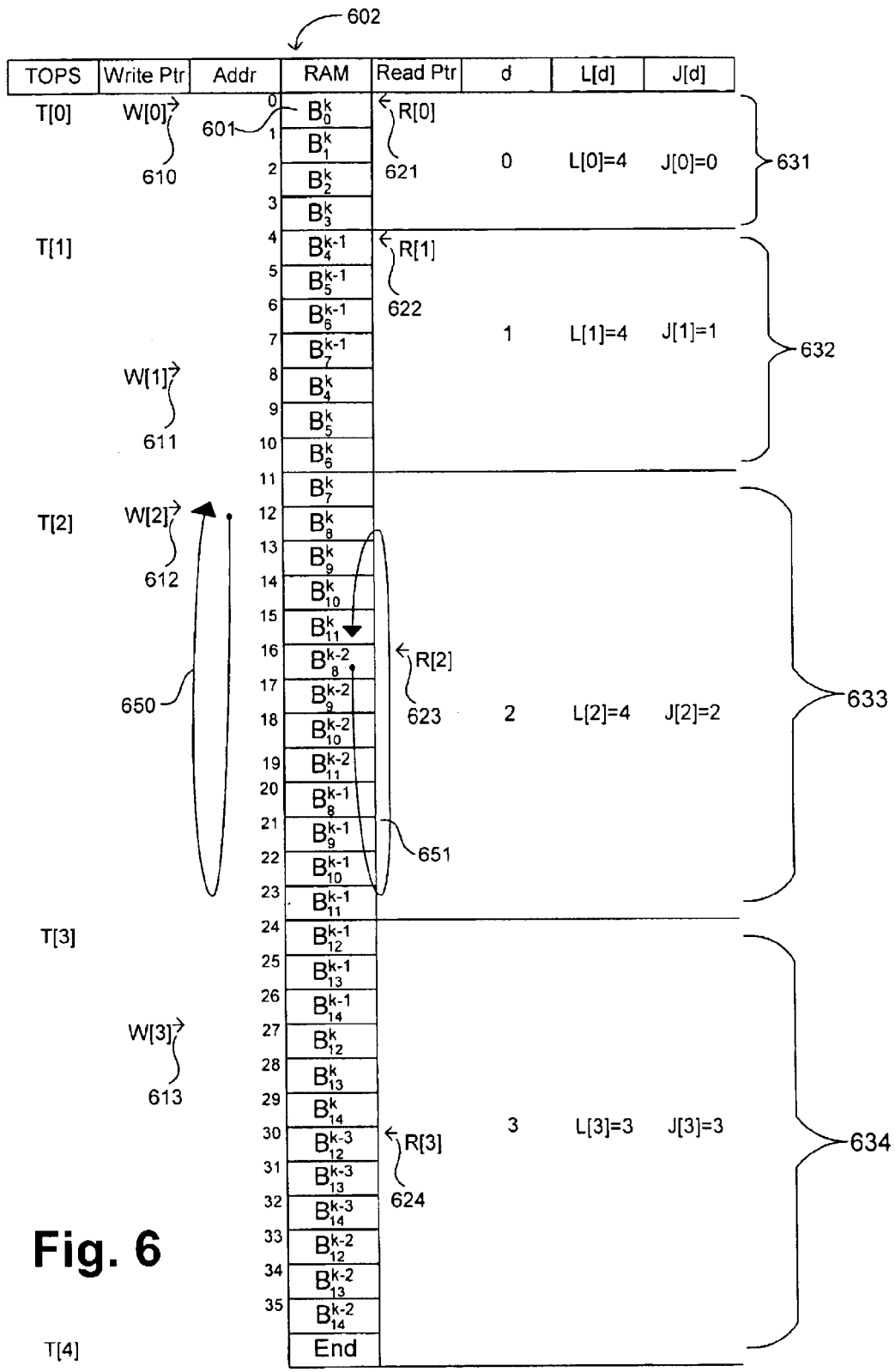
FIG. 6 shows an interleaver memory and pointer system in accordance with one embodiment of the present invention.

FIG. 6 shows one embodiment of the present invention, where N=15 and D=4. In the figure, interleaver memory 602 is configured as a one-dimensional array with addresses from 0 to 35. Significantly, the memory segments are sorted according to the same depth d's and each segment serves as a circular buffer with a specified length L[d]×(d+1).

In general, interleaver memory 602 comprises a series of bytes 601 illustrated in this case as a one-dimensional array. A series of write pointers 610, 611, 612, and 613 are used to address and write individual bytes 601 within interleaver memory 602. Similarly, a series of read pointers 621, 622, 623, and 624 are used to address and read the individual bytes. In accordance with one aspect of the present invention, the read and write pointers act in conjunction with interleaver memory 602 to form a series of circular buffers 631, 632, 633, and 634.

In general, a circular buffer is a bounded queue, where the write and read pointers return to the beginning of the queue after reaching the end, so that old values are overwritten by new values in a circular manner. For example, pointer 612 (W[2]) begins at the $B_8^k$ location and, upon being advanced, addresses the $B_9^k$ location. Movement of pointer 612 progresses until it reaches the memory location corresponding to $B_{11}^{-1}$ (just above the start position for subsequent write pointer 613) then loops back in a circular fashion to the $B_8^k$ location. This is illustrated by loop 650.

Similarly, read pointer 623 progresses in a circular path 651 defined by circular buffer 633. The bytes read from the interleaver RAM 602 need to be placed in the right location in the output vector 300. To that end, we define J[d] as the position in the interleaver output vector of the first byte extracted from the interleaver buffer segment d. Subsequent bytes with the same delay depth will be located at J[d]+D, J[d]+2×D, . . . , J[d]+(L[d]−1)×D locations, respectively, in the interleaver output vector. This set of parameters is preferably used to place the bytes that are read from the interleaver memory 602 into the correct locations in the output vector 300 as in this arrangement the interleaver memory 602 has been sorted according to increasing delay depths. The output buffer position indices J[d] can be calculated as follows:

for odd N:

$$J[0] = 0, J[d] = \left\lceil \frac{Nd}{D} \right\rceil \times D - N \times d = D \sum_{i=0}^{d-1} L[i] - N \times d,$$

$$d = 1, 2, \ldots D-1$$

and for even N:

$$J[0] = D - 1,$$

$$J[d] = \left\lfloor \frac{d(N+1)}{D} \right\rfloor \times D - (N+1) \times d + J[0] = D \sum_{i=0}^{d-1} L[i] - (N+1) \times d + J[0],$$

$$d = 1, 2, \ldots D-1.$$

In some cases, it may be desirable to read one byte at a time and put one byte into the output vector 300 sequentially. In such cases, the output vector is more like a first-in-first-out (FIFO) buffer or a single temporary register. A vector of delay depth may be defined to translate F[J] such that d=F[J[d]]. With F[J] the system can read bytes sequentially in the order of the output vector 300. If post-processing of the interleaved bytes is serial (byte-wise instead of block processing) then the output vector may be omitted completely.

Having thus given a general overview of the present invention, a variety of embodiments will now be described, e.g., an implementation based on multiple pointers, and an implementation based on dynamic calculation of pointers.

A. Implementation Based on Multiple Pointers

One implementation of the interleaver depicted in FIG. 6 will now be described. In general, the system suitably pre-calculates each circular buffer's starting address T[d] (TOPS) as follows:

$$T[0]=0, T[d]=T[d-1]+L[d-1]\times d, d=1,2,\ldots D.$$

Figure 7:
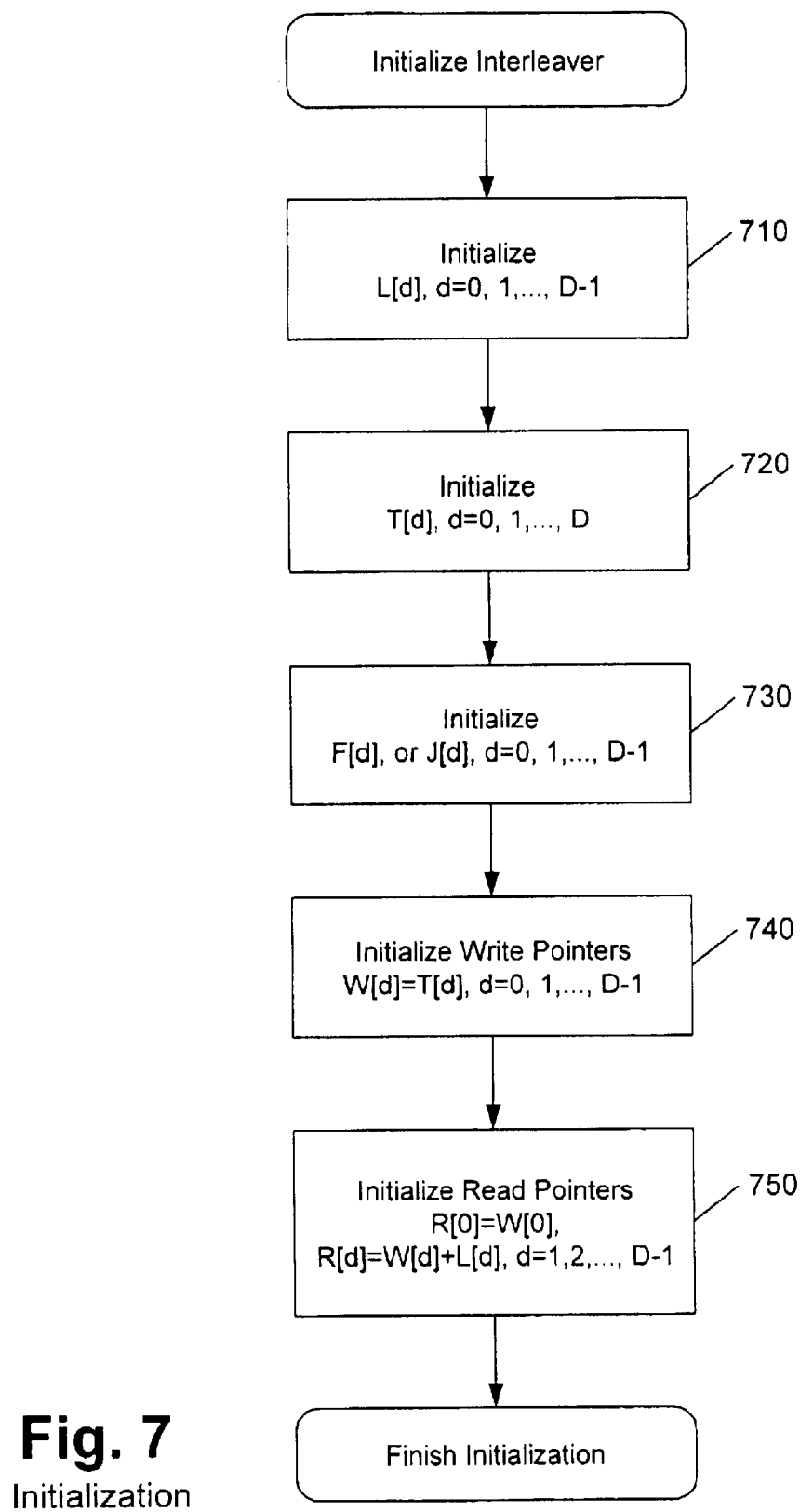
FIG. 7 is a flowchart showing an initialization method in accordance with one embodiment of the present invention.

In one embodiment, write pointers (W[d]) and read pointers (R[d]) are preferably initialized and L[d], F[d] (or J[d]) and T[d] are pre-calculated. In this regard, FIG. 7 shows an exemplary initialization procedure. First, the system initializes L[d], T[d], and F[d] (or J[d]) in steps 710, 720, and 730 respectively. Next, the write and read pointers are initialized (steps 740 and 750) as so:

$$W[d]=T[d], d=0,1,\ldots, D-1,$$

$$R[0]=W[0], R[d]=W[d]+L[d], d=1,2,\ldots, D-1$$

Figure 8:
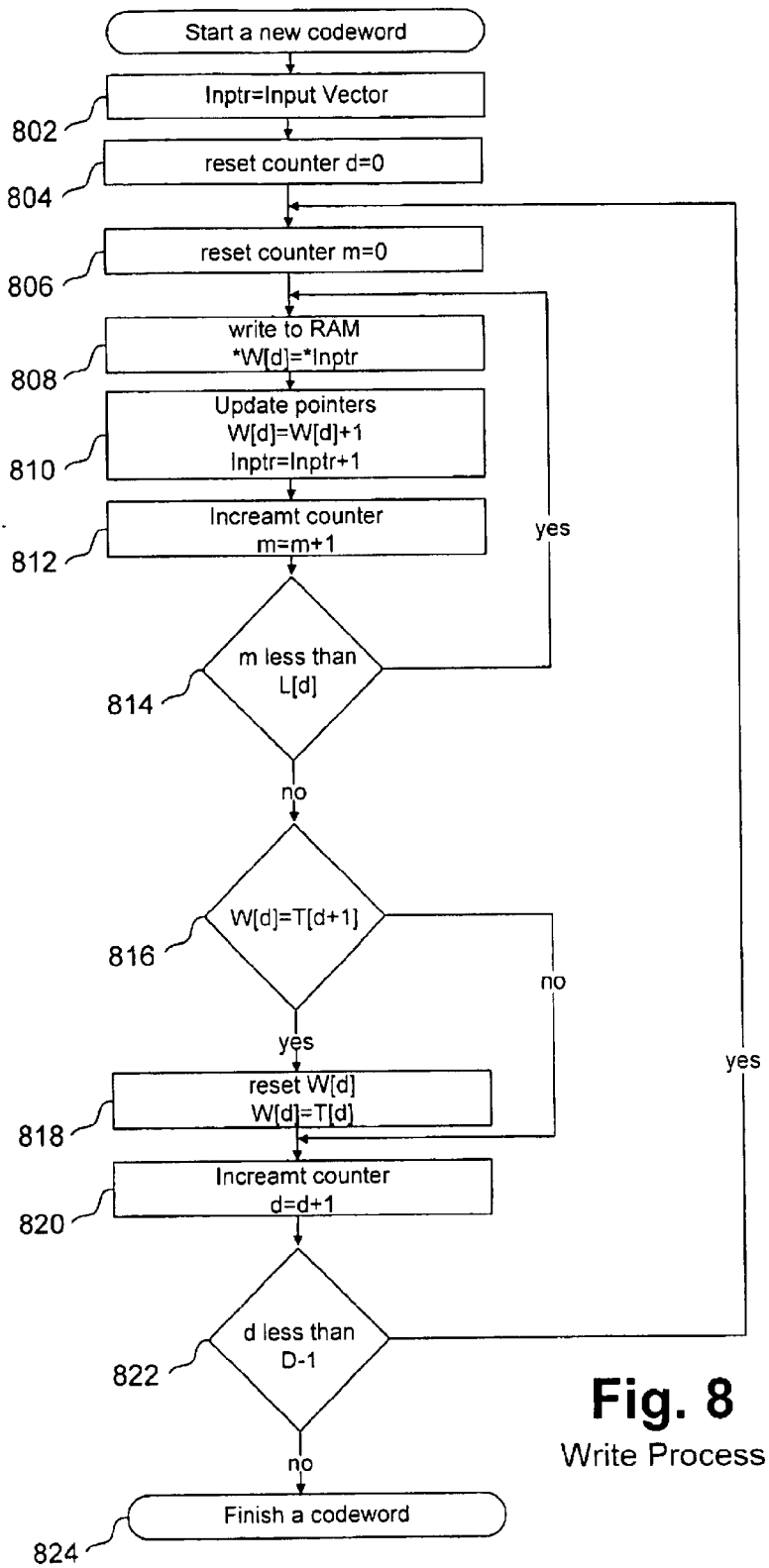
FIG. 8 is a flowchart showing a write process in accordance with one embodiment of the present invention.
Figure 9:
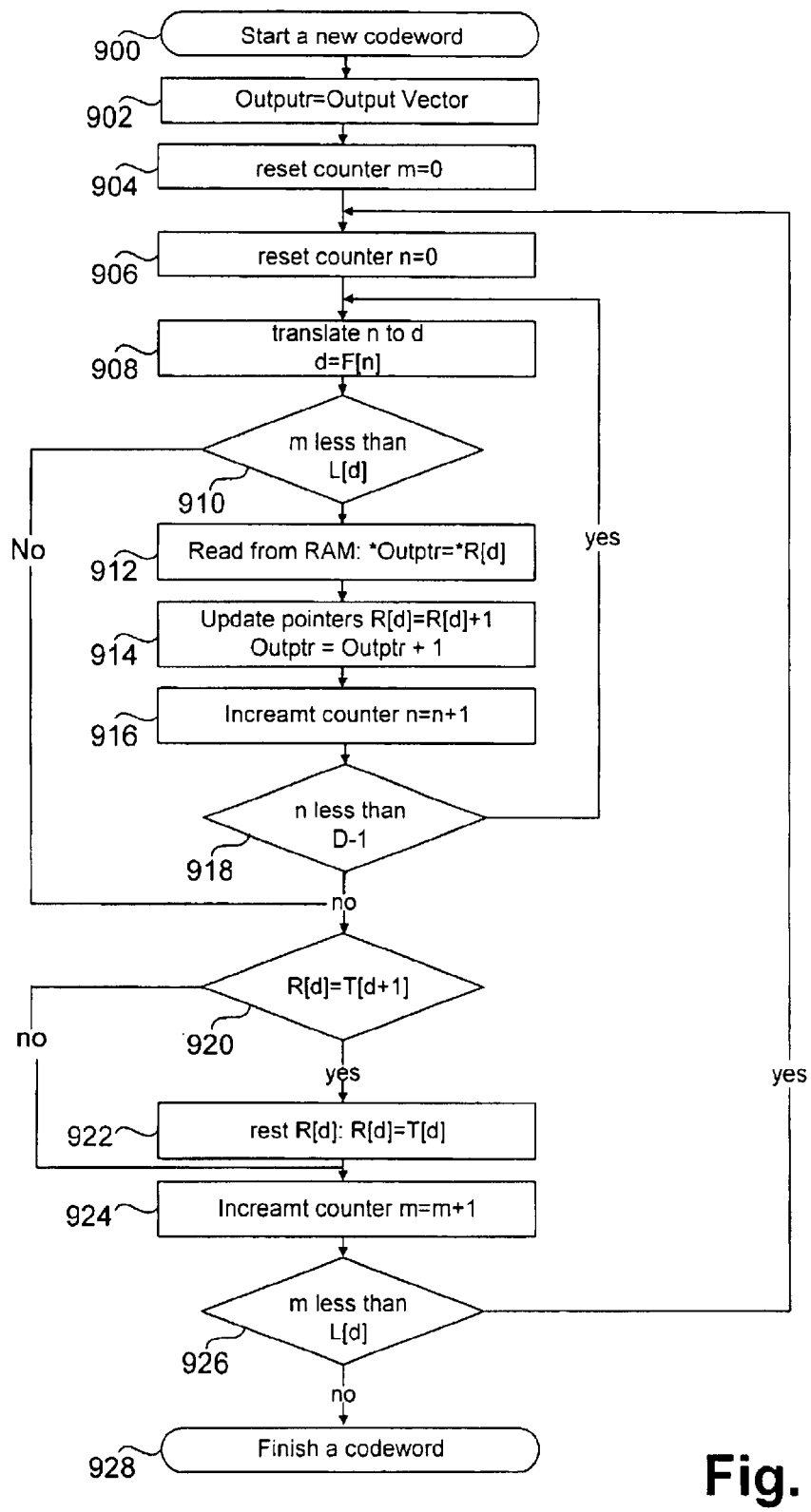
FIG. 9 is a flowchart showing a read process in accordance with one embodiment of the present invention.

In accordance with one embodiment of the present invention, the system commences with interleaving as shown in FIGS. 8 and 9, which show example write and read processes, respectively. First, in step 802, input vector 200 is acquired through any convenient method (Inptr) and, in steps 804 and 806, various counters are reset such that d=0 and m=0.

Next, in step 808, the system writes to RAM, e.g. *W[d]= *Inptr (using standard C-language pointer syntax). The pointers are then updated such that W[d]=W[d]+1 and Inptr=Inptr+1 (step 810) and the counter m is incremented such that m=m+1 (step 812).

The next step then queries whether m is less than L[d] (step 814). If so, the system proceeds to step 808 and continues as previously described. This step confirms that the system has written all elements with delay depth d. If so, i.e., if m is not less than L[d], then the system continues with step 816, where the system performs a second query of whether W[d] is equal to T[d+1]. This step checks whether the circular buffer of depth d has reached circular buffer boundary. If so, W[d] is reset to the circular buffer top, i.e., T[d] (step 818); if not, the system continues to step 820, where the counter is incremented such that d=d+1.

In step 822, the system finally queries whether the system has more delay depths to go. If so, i.e., d<D−1, processing loops back to step 806 (outer loop) and continues as before. Otherwise, writing of the codeword is completed (step 824).

Referring now to FIG. 9, an exemplary read process will now be described. In general, the system reads interleaved bytes non-sequentially and puts them into the output vector sequentially. There are two processing loops in the read process (FIG. 9). The inner loop includes steps 908, 910, 912, 914, 916, and 918, and the outer loop includes steps 906, 920, 922, 924, 926 and the inner loop steps.

First, a new codeword is suitably started (step 900) and the output pointer Outptr is set to the output vector 300 (step 902). Next, the counters m and n are reset to zero (steps 904 and 906 respectively). In the inner loop, for each n, the system translates n to d through step 908 (d=F[n]). The next step (910 ensures that m is less than L[d] when the system reads interleaved bytes. If so, the system reads from RAM such that *Outptr=*R[d] (step 912). The pointers are then updated such that R[d]=R[d]+1 and Outptr=Outptr+1 (step 914) and increment the counter n=n+1; If m is not less than L[d], processing exits from the inner loop and continues with step 920. After incrementing n, the system queries whether n reaches D−1. If not, processing continues with step 908 as described before. If yes, the system exits from the inner loop and continues with step 920. After exiting from the inner loop, the system checks whether the read pointer has reached T[d+1]. If yes, R[d] is reset to T[d] (steps 920 and 922 respective the outer loop counter m is incremented (m=m+1) (step 924). Next, if m is less than L[d], the system loops back to step 906. Otherwise, the codeword read process is complete (step 928).

It will be appreciated that, in an alternate embodiment, the write pointers may be first advanced until the end of input vector is reached, followed by reading of memory 602 and advancement of the read pointers to produce the completed output vector. That is, as long as writing to memory 602 occurs before the read operation, the order of movement for the read and write pointers may be varied.

For example, the implementation described in conjunction with FIGS. 8 and 9 does not require input and output buffers. It can read one byte from the R-S encoder and write it into the interleaver RAM 602. It can also read one interleaved byte from 602 and send it out for further processing.

Figure 10:
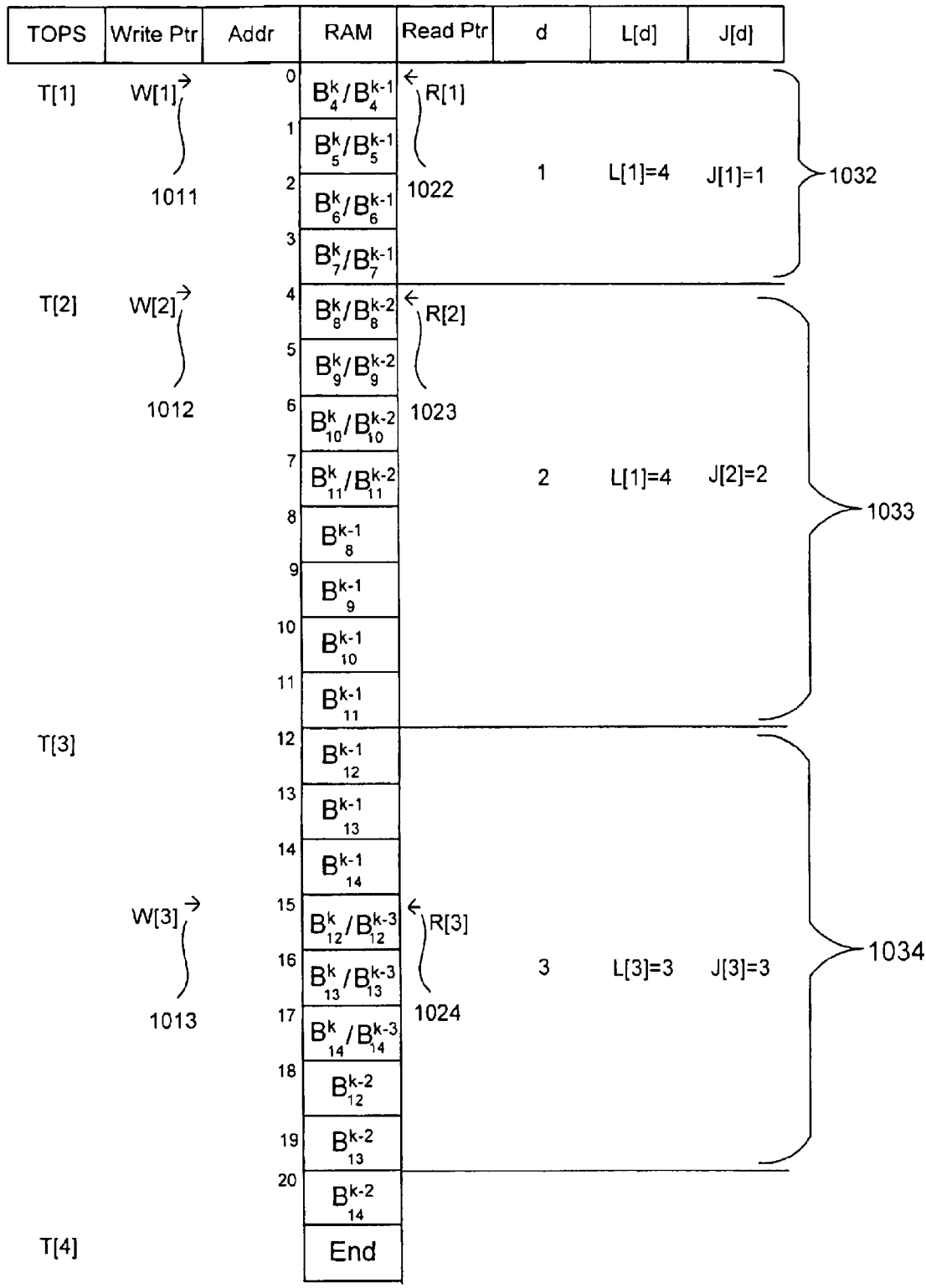
FIG. 10 shows an interleaver memory and pointer system in accordance with one embodiment of the present invention.

When an output vector buffer 300 is available for output, all bytes with d=0 can be moved into the output buffer directly in locations J[0], J[0]+D, . . . , J[0]+(L[0]−1)D. Furthermore if read operations are performed before write operations (swapping), the total interleaver RAM size can be reduced by N bytes. FIG. 10 shows such a RAM arrangement. Top addresses T[d] can be calculated as follows:

$$T[1]=0, T[d]=T[d-1]+L[d-1]\times d, d=2,3\ldots D$$

Read and write pointers are the same and are initialized to corresponding top addresses as:

$$W[d]=R[d]=T[d], d=1,2,\ldots D-1.$$

While the FIG. 6 embodiment performs writing to the interleaver memory before reading out mature bytes to the output, an alternate embodiment, shown in FIG. 10, uses a more compact memory arrangement wherein reading occurs prior to the write operation. That is, if the system swaps out mature bytes with incoming (new) ones in interleaver memory, the system can keep the read pointers and write pointer in the same location within a given circular buffer. As illustrated, the interleaver employs a plurality of read pointers 1022, 1023, and 1024 associated with respective circular buffers 1032, 1033, and 1034. A plurality of write pointers equal to the number of read pointers, and corresponding to the same memory location, are also associated with each of the circular buffers. That is, write pointers 1011, 1012, and 1013 correspond to read pointers 1022, 1023, and 1024 respectively.

Figure 11:
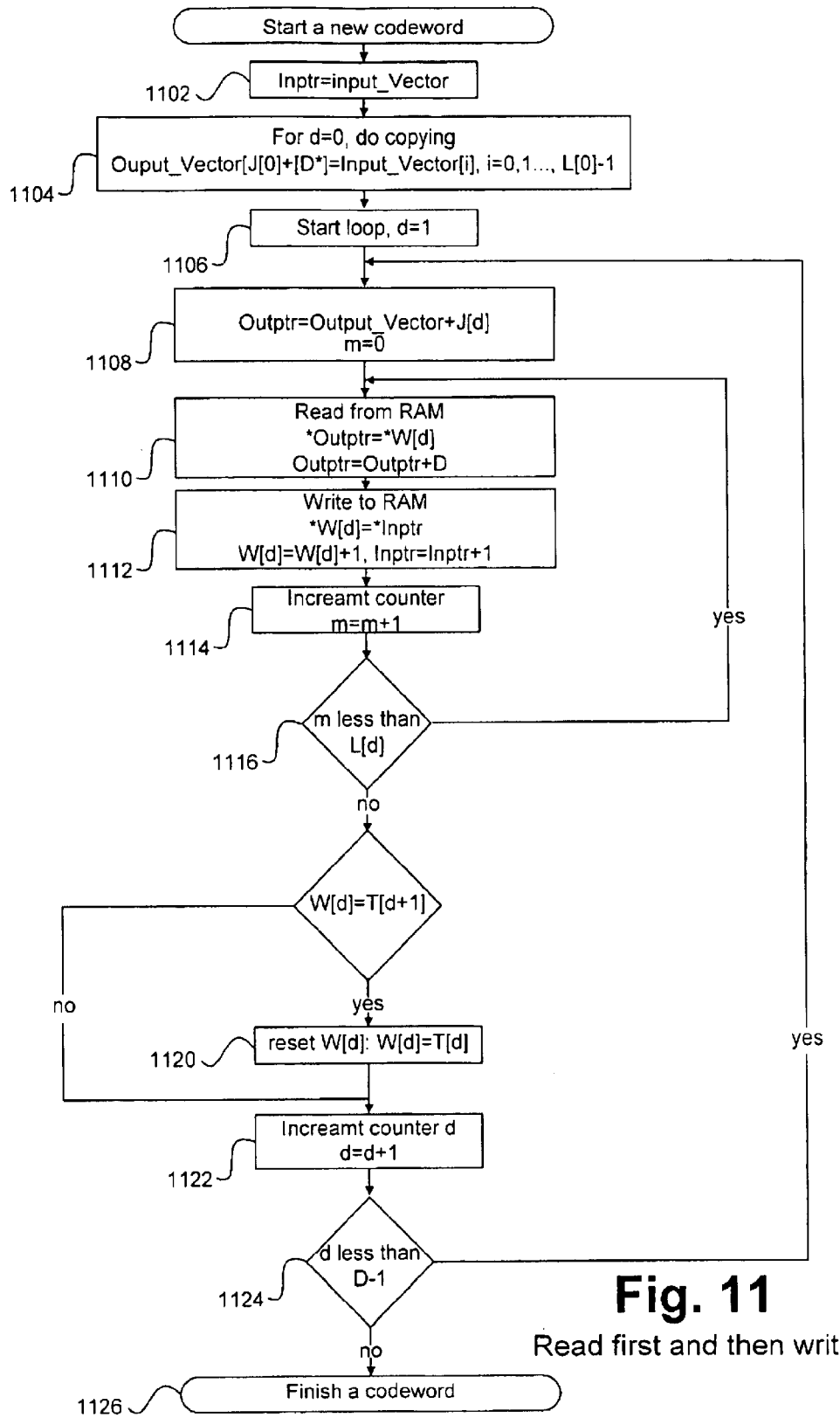
FIG. 11 is a flowchart showing an exemplary read-first method in accordance with one embodiment of the present invention.

Referring now to FIG. 11, and exemplary read-first embodiment starts with assigning an input vector (step 1102) then, for d=0, copying the input vector to the output vector such that Output_Vector[J[0]+i*D]=Input_Vector[i] for all i=0 to L[0]−1 (step 1104). Then, step 1106, the output loop is started with d=1. Steps 1110, 1112, 1114, and 1116 form a swapping loop. The output pointer is set to Output_Vector+J[d], and m=0 (step 1108). Next, the system reads from RAM such that *Outptr=*W[d] and sets Outptr= Outptr+D (step 1110). After performing the reading operation of step 1110, the system accomplishes writing of the individual RAM elements, e.g., *W[d]=*Inptr, W[d]=W[d]+ 1, Inptr=Inptr+1 (step 1112). The m counter is then incremented (m=m+1) in step 1114. The swapping continues until the system has swapped all L[d] bytes for a given d. The loop condition is controlled by step 1116.

After finishing the swapping loop detailed above, the system again queries whether W[d] is equal to T[d+1] (the circular buffer wrapping condition). If so, W[d] is reset to T[d] (step 1120). In any event, counter d is then incremented (step 1122) and the system queries whether d is less than D−1 (step 1124). If so, the system loops back to step 1108; If not, the codeword is finished (step 1126).

B. Implementation of Dynamic Calculation of Pointers

In the above mentioned implementations in FIGS. 6–9 and FIGS. 10–11, L[d], F[d] (or J[d]), and t[d]) are pre-calculated and R[d] and W[d] are updated during normal operation. To reduce the number of parameters needed in the operation, we can explore correlations of some of the parameters. For the RAM arrangement as FIG. 6, read pointers R[d] are always offset from W[d] by L[d] subject to the circular rule. Therefore, in accordance with another embodiment, the R[d] pointers are calculated directly from w[d]. As will be shown, L[d] only take two possible values, e.g., L[0] or L[]−1.

With continued reference to FIG. 6, the write and read pointers are preferably dynamically updated for each codeword index k. Specifically, the write pointers 610, 611, 612, and 613 can be updated according to the following rules:

$$W[0]=0$$

$$W[0] = 0,$$

$$W[d] = \sum_{i=0}^{d-1} (i+1) \times L[i] + (k \bmod (d+1) \times L[d]$$

$$d = 1, 2, \ldots, D-1.$$

and similar rules can be applied to the read pointer updates:

$$R[0]=0,$$

$$R[d] = \sum_{i=0}^{d-1} (i+1)L[i] + ((k-d) \bmod (d+1)) \times L[d]$$

$$d = 1, 2, \ldots, D-1$$

Therefore, during run time, w[d] and R[d] can be updated for a given k according to the above equations. If the system implements the pointer updates in hardware, it is preferable to remove multiplication from the foregoing equations. To that end, if we define C[d] as an inner pointer for each of d-segment (circular buffer) and updated independently as $$C[d]=(C[d]+L[d]) \bmod ((d+1) \times L[d]), d=1,2,\ldots,D-1$$

then we can remove dependency of k from the write and read pointers calculations. For each k, C[d] is first updated and then the write and read pointers can be computed in terms of C[d] as:

$$W[d]=T[d]+C[d], R[d]=T[d]+((C[d]+L[d]) \bmod ((d+1) \times L[d])),$$
$$d=1,2,\ldots,D-1.$$

Further, the top address T[d] can also be calculated recursively from T[d−1] as:

$$T[d]=T[d-1]+d \times L[d-1], d=1,2,\ldots,D.$$

It will show that further elimination of the vector L[d] is possible. By examining the above expression of L[d], it can be proven that L[d] can only take two possible values. First, consider the case of N and D co-primed and N=(L[0]−1)× D+r where 0<r<D and r≠0 because N odd. We can express L[d] in terms of J[d], and r as:

$$L[d] =$$

$$\left\lceil \frac{N - J[d]}{D} \right\rceil = L[d] - 2 + \left\lceil 1 + \frac{r - J[d]}{D} \right\rceil = \begin{cases} L[0]-1, & \text{if } J[d] \geq r > 0 \\ L[0], & \text{if } J[d] > r \end{cases}$$

where J[d], and r are less than D. For N even, we define N=L [0]×D+r−1 and then we have:

$$L[d] =$$

$$\left\lceil \frac{N - J[d]}{D} \right\rceil = L[0] - 1 + \left\lceil 1 + \frac{r - 1 - J[d]}{D} \right\rceil = \begin{cases} L[0]-1, & \text{if } J[d] \geq r-1 \\ L[0]+1, & \text{if } J[d] > r-1 \end{cases}$$

where L[d] is expressed in terms of J[d]. Actually, J[d] can be rewritten in a recursive form as:

$$J[d] = J[d-1] + D \times L[d-1] - \begin{cases} N, & N \text{ odd} \\ N+1, & N \text{ even} \end{cases}.$$

If D is power of two as in xDSL applications, the multiplication in the above expression can be implemented as left shifting in hardware. The parameter F[J] can also be calculated as:

$$F[J]=(J \times F[1]) \bmod D, J=2,3,\ldots,D-1.$$

Now, we only need to pre-calculate L[0], F[0], F[1], J[0], r and initialize C[d]=0, d0,1, . . . , D−1. Then, for each given k-th codeword the rest of parameters (pointers) can be calculated recursively in order of d=0 to D−1.

Similarly, if the RAM arrangement is configured as shown in FIG. 10, the read and write pointers can be updated as so:

$$W[d] = \sum_{i=1}^{d-1} i \times L[i] + (k \bmod d) \times L[d], \quad d = 1, 2, \ldots, D-1.$$

The corresponding C[d] is updated as $$C[d]=(C[d]+L[d]) \bmod (d \times L[d]), d=1,2,\ldots,D-1.$$

Figure 12:
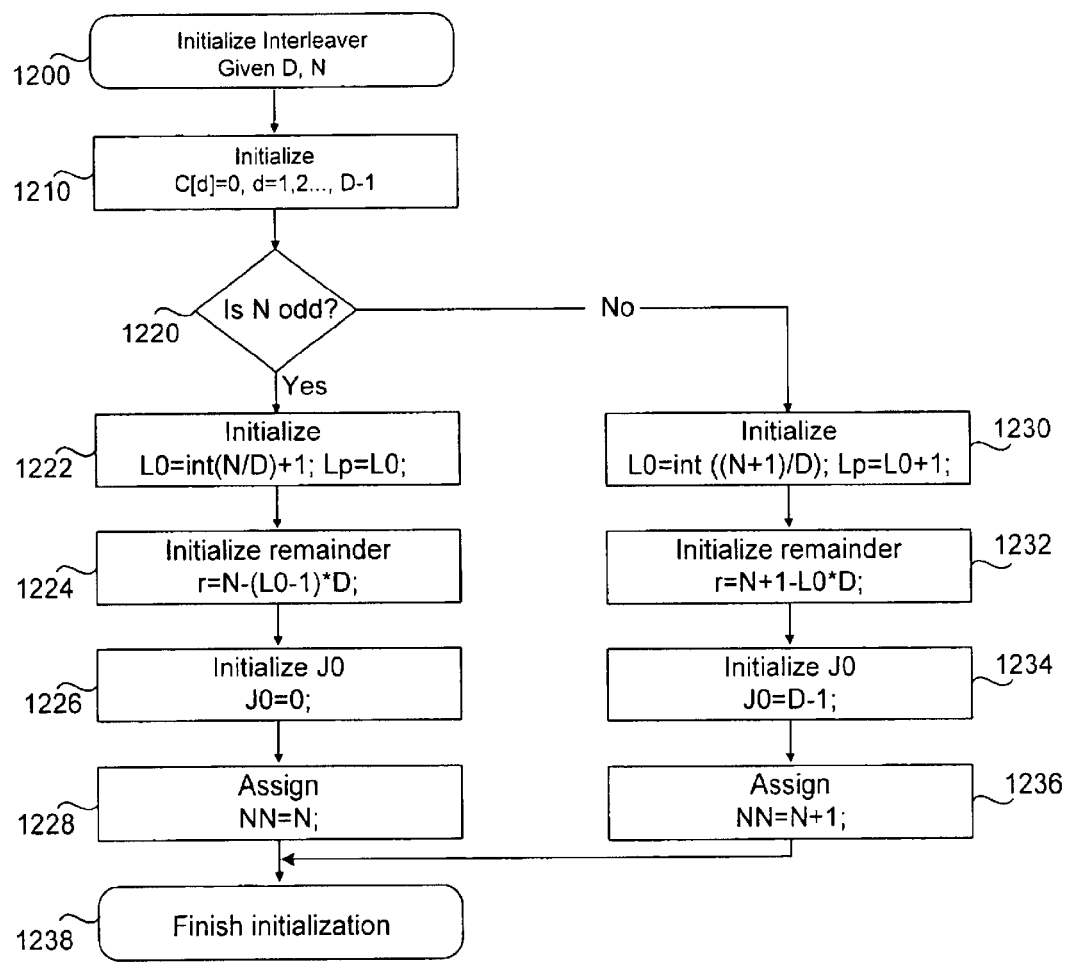
FIG. 12 is a flowchart showing an initialization method in accordance with one embodiment of the present invention.

Referring now to FIG. 12, the initialization procedure 1200 of the convolutional interleaver illustrated in FIG. 10 will now be described. As noted in step 1210, the system initializes C[d] to zero for all d=1, 2, . . . , D−1. The system then initializes various other parameters depending upon whether N is odd or even. More particularly, the system queries whether N is odd (step 1220). If not N is odd, the following initializations take place: L0=int(N/d)+1, and Lp=L0 (step 1222); the remainder is initialized r=N−(L0−

1)×D (step 1224); J0 is set to 0 (step 1226), and N/N is set to N(step 1228). The initialization is then complete (step 1238).

If, in step 1220, it was determined that N is even, the following initializations take place: L0=int((N+1)/D) and Lp=L0+1 (step 1230); r=N+1−L0×D (step 1232); J0=D−1 (step 1234); and NN=N+1 (step 1236). Initialization is then complete (step 1238).

Figures 1, 13:
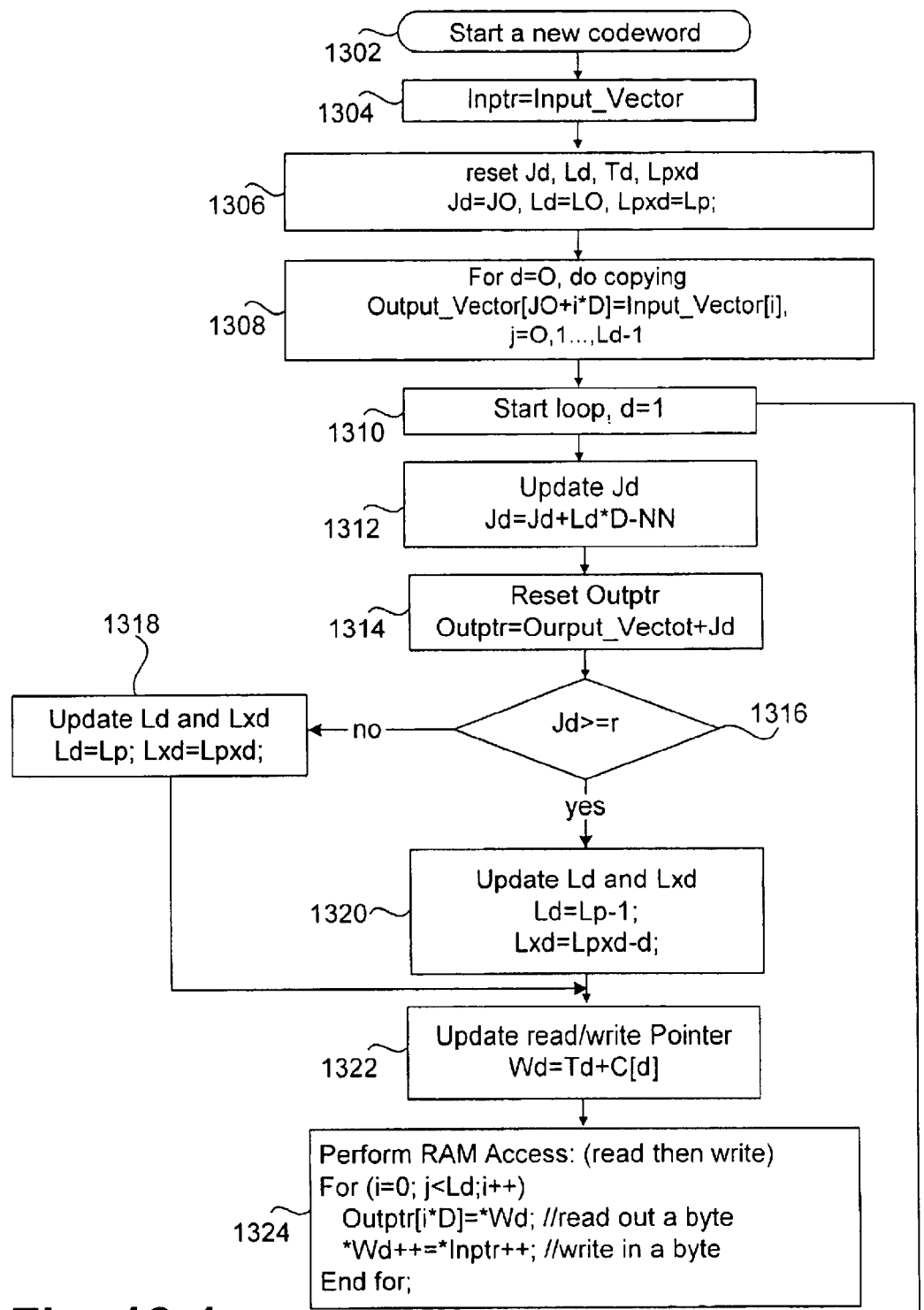
FIG. 13 is a flowchart showing an interleaver method in accordance with one embodiment of the present invention.
Figures 2, 13:
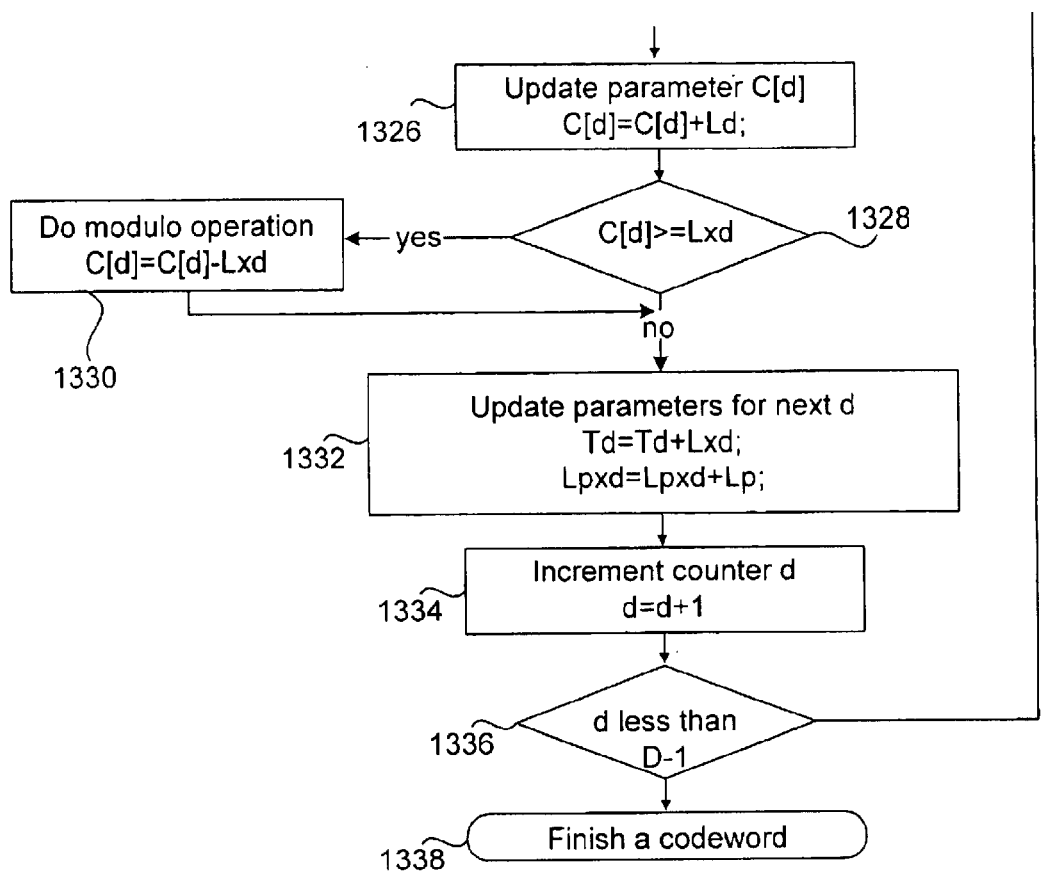

Having thus described an exemplary initialization step, a flow chart depicting operation of an interleaver in accordance with the present invention is illustrated in FIG. 13. First, the system begins processing a new codeword (step 1302). This involves setting the input equal to the input vector 200 step (1304). Next, the system suitably resets Jd, Ld, Td, and Lpxd. In a preferred embodiment, Jd is set to J0, Ld is set to L0, Td is set to 0, and Lpxd is set to Lp (step 1306).

After resetting the aforementioned parameters, the system loops through a copying step (step 1308) wherein the output vector is suitably initialized for d=0; e.g., for i=0, 1, . . . Ld−1, Output_Vector[J0+i *D]=Input_Vector[i].

Next, in step 1310, the main loop is started with=1. The system then updates Jd (step 1312) and resets the Output pointer (Outptr) (step 1314). In the illustrated embodiment, Jd is updated as Jd=Jd+Ld×D−NN, and the output pointer is set to Outptr=Output_Vector+Jd.

The system then queries whether Jd>=r (step 1316). If so, the system continues to step 1320, where Ld and Lxd are updated (e.g., Ld=Lp−1, and Lxd=Lpxd−d); If not, the system updates Ld and Lxd such that Ld=Lp and Lxd=Lpxd (Step 1318). In any event, processing then commences with step 1322, where the read/write pointer is updated such that Wd=Td+C[d].

Next, in step 1324, the system performs RAM access, in this case using a read-then-write scheme. In the preferred embodiment, the system loops from i=0 to i<Ld, and sets the output and input pointers such that Outptr[i*D]=*Wd and *Wd++=*Inptr++. It will be appreciated that while this process is described using standard C programming language syntax and pointer variables, any suitable programming language may be used to implement the present invention.

After performing RAM access, the system updates the C[d] parameter such that C[d]=C[d]+Ld (step 1326). Next, the system queries whether C[d]>=Lxd (step 1328). If so, a modulo operation is performed, e.g., C[d]=C[d]−Lxd (Step 1330), and processing continues at step 1332. In step 1332, the parameters are updated for the next value of d, e.g., Td=Td+Lxd, and Lpxd=Lpxd+Lp.

Next, the counter value d is incremented (step 1334) and the system queries whether d is less than D−1 (step 1336). If so, the system loops back to step 1312, where processing continues as described above. If d is not less than D−1, the codeword is complete (step 1338).

The algorithm presented above attempts to minimize the number of parameters for pointer calculations. If the system attempts to minimize the computational complexity of the algorithm, we can simply use the circular buffer approach presented in the first approach. Finally, it will be appreciated that the algorithms discussed above read bytes sequentially from the input vector 200 and write bytes to the output vector 300 according to given indices J[d]. It can be shown that the system may also read bytes from the input buffer according to the indices J[d] given above and write the bytes sequentially.

While the above description and drawings focus on operation of interleaver 120 in FIG. 1, those skilled in the art will be able to apply the concepts and algorithms described above in an inverse manner to make and use a de-interleaver 130. In this regard, RAM arrangements for exemplary de-interleavers are presented in FIG. 14 and FIG. 15 with respect to their interleaver counterparts in FIG. 6 and FIG. 10, respectively.

In the figures, write (W[d]) and read (R[d]) pointers, and top addresses (T[d]) can be calculated in an exact same way as in the interleaver cases but the values of L[d], F[J] (or J[d]) in the interleaver now correspond to those of L[D−d−1], F[J] (or JD−d−1)) in the de-interleaver.

Figures 1, 14:
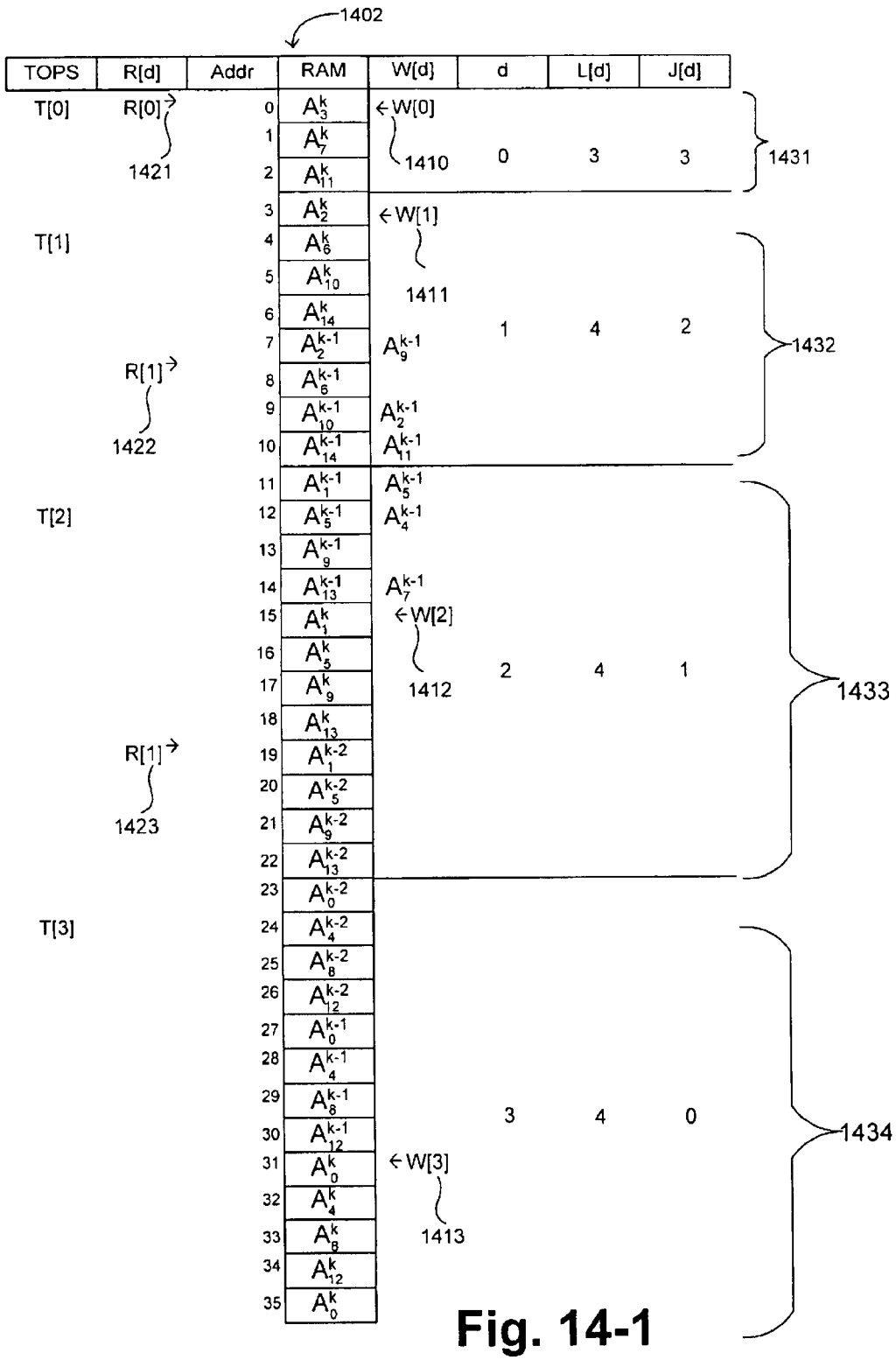
FIG. 14 shows a de-interleaver memory arrangement in accordance with one embodiment of the present invention.
Figures 2, 14:
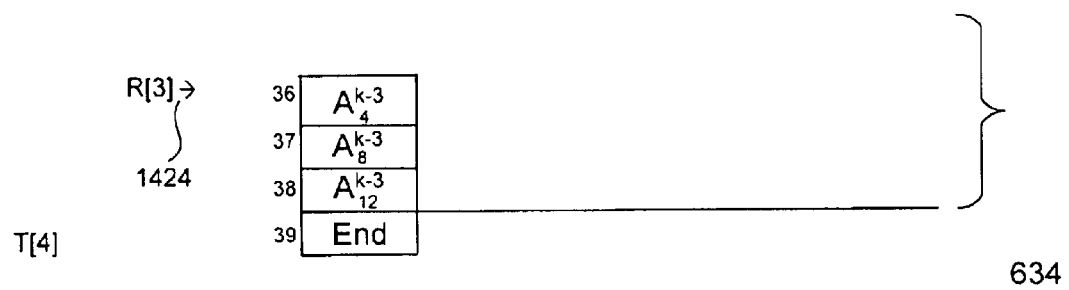

Referring now to FIG. 14, the de-interleaving system, consistent with FIG. 6, has arranged the de-interleaving RAM 1402 according to increasing d (0, 1, 2, 3). As with the interleaver previously described, the RAM 1402 is partitioned into a plurality of circular buffers, e.g., 1431, 1432, 1433, and 1434.

In general, the system reads a byte as input and place it into the proper d-segment pointed to by F[j] and W[d]. That is, write pointers W[d] comprise a plurality of pointers 1410, 1411, 1412, and 1413, and read pointers R[d] comprise a plurality of pointers 1421, 1422, 1423, and 1424. The de-interleaved bytes can be read out from D−1 segment first, then D−2 and so on. The order of the output bytes will be in their natural order.

Figure 15:
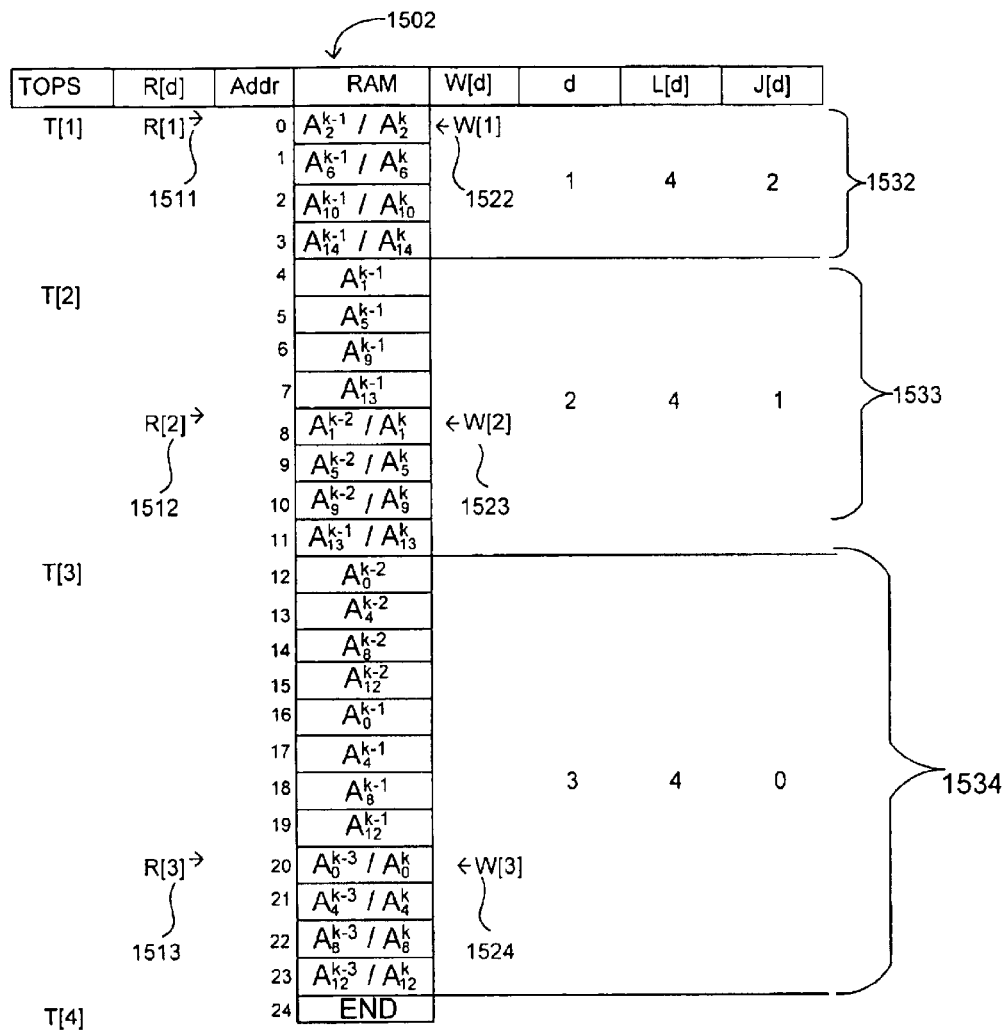
FIG. 15 shows a de-interleaver memory arrangement in accordance with one embodiment of the present invention.

FIG. 15 depicts an exemplary de-interleaver corresponding to the interleaver previously described in conjunction with FIG. 10. Generally, the RAM 1502 is partitioned into a plurality of circular buffers. In this embodiment, there are three circular buffers 1532, 1533 and 1534. Each of the circular buffers has an associated write pointer (e.g., pointers 1522, 1523, and 1524) and read pointer (e.g., pointers 1511, 1512, 1513).

In summary, a variety of highly-efficient interleaver (and de-interleaver) embodiments have been presented. In accordance with various aspects of the present invention, the size of interleaver memories used in a wide range of communication devices can be reduced by approximately 50% over conventional systems. It should be understood, however, that the exemplary processes illustrated above include more or less steps or may be performed in the context of a larger processing scheme. Furthermore, although the invention has been described herein in conjunction with the appended drawings, those skilled in the art will appreciate that the scope of the invention is not so limited. For example, the present invention is not limited to data communication contexts as illustrated in FIG. 1. Indeed, any system which employs convolutional interleaving would profit form the techniques described herein, for example, system for producing and reading CDROMS, Music CDs, DVDs, and the like. Modifications in the selection, design, and arrangement of the various components and steps discussed herein may be made without departing from the scope of the invention as set forth in the appended claims.

What is claimed is:

1. A convolutional interleaver comprising:
   an interleaver memory partitioned into a plurality of circular buffers, wherein each of said plurality of circular buffers has a write pointer and a read pointer associated therewith; and
   a processor configured to selectively read input symbols from an input vector and store said input symbols in said interleaver memory in accordance with said write pointers, and to selectively read output symbols from said interleaver memory and store said output symbols in an output vector in accordance with said read pointers;

wherein said interleaver memory is characterized by an interleaving depth and includes elements having associated interleaving delay depths, wherein said interleaving delay depths are less than said interleaving depth, wherein each of said plurality of circular buffers is assigned a different interleaving delay depth and wherein said plurality of circular buffers are sorted according to said interleaving delay depths.

2. The convolutional interleaver of claim 1, wherein said processor is further configured to store said input symbols in said interleaver memory prior to reading said output symbols from said interleaver memory.

3. The convolutional interleaver of claim 2, wherein said interleaver memory is characterized by a block length and said interleaving depth.

4. The convolutional interleaver of claim 3, wherein said block length and said interleaving depth are co-primed.

5. The convolutional interleaver of claim 3, wherein said block length and said interleaving depth are not co-primed.

6. The convolutional interleaver of claim 2, wherein the number of said circular buffers is said interleaving depth.

7. The convolutional interleaver of claim 2, wherein the position of said read pointers within each of said circular buffers is computed based on the position of said write pointers.

8. The convolutional interleaver of claim 1, wherein the position of each of said write pointer within each of said circular buffers corresponds to the position of a corresponding one of said read pointers, and wherein said processor is further configured to read said output symbols from said interleaver memory prior to storing said input symbols in said interleaver memory.

9. The convolutional interleaver of claim 8, wherein the number of said circular buffers is one less than said interleaving depth.

10. A convolutional de-interleaver comprising:
   a de-interleaver memory partitioned into a plurality of circular buffers, wherein each of said plurality of circular buffers has a write pointer and a read pointer associated therewith; and
   a processor configured to selectively read interleaved symbols from a de-interleaver input vector and store said interleaved symbols in said de-interleaver memory in accordance with said write pointers, and to selectively read de-interleaved symbols from said de-interleaver memory and store said de-interleaved symbols in a de-interleaved output vector in accordance with said read pointers;
   wherein said de-interleaver memory is characterized by an interleaving depth and includes elements having associated interleaving delay depths, wherein said interleaving delay depths are less than said interleaving depth, wherein each of said plurality of circular buffers is assigned a different interleaving delay depth, and wherein said plurality of circular buffers are sorted according to said. interleaving delay depths.

11. The convolutional de-interleaver of claim 10, wherein said processor is further configured to store said interleaved symbols in said de-interleaver memory prior to reading said de-interleaved symbols from said de-interleaver memory.

12. The convolutional de-interleaver of claim 10, wherein the position of each of said write pointer within each of said circular buffers corresponds to the position of a corresponding one of said read pointers, and wherein said processor is further configured to read said de-interleaved symbols from said de-interleaver memory prior to storing said interleaved symbols in said de-interleaver memory.

13. A method of convolutionally interleaving an input vector to produce an interleaved output vector, said method comprising:
   partitioning an interleaver memory into a plurality of circular buffers, wherein each of said plurality of circular buffers has a write pointer and a read pointer associated therewith;
   selectively reading input symbols from said input vector;
   storing said input symbols in said interleaver memory in accordance with said write pointers;
   selectively reading output symbols from said interleaver memory;
   storing said output symbols in said output vector in accordance with said read pointers;
   wherein said interleaver memory is characterized by an interleaving depth and includes elements having associated interleaving delay depths, wherein said interleaving delay depths are less than said interleaving depth, wherein each of said plurality of circular buffers is assigned a different interleaving delay depth, and wherein said plurality of circular buffers are sorted according to said interleaving delay depths.

14. The method of claim 13 further comprises: storing said input symbols in said interleaver memory prior to said reading said output symbols from said interleaver memory.

15. The method of claim 14, wherein said interleaver memory is characterized by a block length and said interleaving depth.

16. The method of claim 15, wherein said block length and said interleaving depth are co-primed.

17. The method of claim 15, wherein said block length and said interleaving depth are not co-primed.

18. The method of claim 14, wherein the number of said circular buffers is said interleaving depth.

19. The method of claim 14, wherein the position of said read pointers within each of said circular buffers is computed based on the position of said write pointers.

20. The method of claim 13, wherein the position of each of said write pointer within each of said circular buffers corresponds to the position of a corresponding one of said read pointers, and wherein said method further comprises: reading said output symbols from said interleaver memory prior to said storing said input symbols in said interleaver memory.

21. The method of claim 20, wherein the number of said circular buffers is one less than said interleaving depth.

22. A method of convolutionally de-interleaving a de-interleaver input vector to produce an de-interleaved output vector, said method comprising:
   partitioning a de-interleaver memory into a plurality of circular buffers, wherein each of said plurality of circular buffers has a write pointer and a read pointer associated therewith;
   selectively reading interleaved symbols from said de-interleaver input vector;
   storing said interleaved symbols in said de-interleaver memory in accordance with said write pointers;
   selectively reading de-interleaved symbols from said de-interleaver memory;
   storing said de-interleaved symbols in said de-interleaved output vector in accordance with said read pointers;
   wherein said de-interleaver memory is characterized by an interleaving depth and includes elements having associated interleaving delay depths, wherein said interleaving delay depths are less than said interleaving depth, wherein each of said plurality of circular buffers is assigned a different interleaving delay depth, and wherein said plurality of circular buffers are sorted according to said interleaving delay depths.

23. The method claim 22, further comprises: storing said interleaved symbols in said de-interleaver memory prior to said reading said de-interleaved symbols from de-interleaver memory.

24. The method of claim 22, wherein the position of each of said write pointer within each of said circular buffers corresponds to the position of a corresponding one of said read pointers, and wherein said method further comprises: reading said de-interleaved symbols from said de-interleaver memory prior to said storing said interleaved symbols in said de-interleaver memory.

* * * * *